United States Patent
Strauch et al.

(10) Patent No.: US 6,786,973 B2
(45) Date of Patent: Sep. 7, 2004

(54) METHOD FOR DEPOSITING IN PARTICULAR CRYSTALLINE LAYERS, GAS-ADMISSION ELEMENT AND DEVICE FOR CARRYING OUT THE METHOD

(75) Inventors: Gerd Strauch, Aachen (DE); Markus Reinhold, Aachen (DE)

(73) Assignee: Aixtron AG (DE)

( * ) Notice: Subject to any disclaimer, the term of this patent is extended or adjusted under 35 U.S.C. 154(b) by 0 days.

(21) Appl. No.: 10/395,949

(22) Filed: Mar. 24, 2003

(65) Prior Publication Data

US 2003/0180460 A1 Sep. 25, 2003

Related U.S. Application Data

(63) Continuation of application No. PCT/EP01/10078, filed on Aug. 31, 2001.

(30) Foreign Application Priority Data

Sep. 22, 2000 (DE) .......................................... 100 47 562
Dec. 23, 2000 (DE) .......................................... 100 64 944

(51) Int. Cl.$^7$ ............................................. C23C 16/00
(52) U.S. Cl. ........................... 118/715; 222/3; 239/461; 422/224; 438/478
(58) Field of Search ........................... 118/715; 222/3; 239/461; 422/224; 438/478

(56) References Cited

U.S. PATENT DOCUMENTS

| | | | | |
|---|---|---|---|---|
| 4,033,286 A | * | 7/1977 | Chern et al. ................ | 118/725 |
| 4,858,557 A | * | 8/1989 | Pozzetti et al. ............. | 118/725 |
| 5,620,523 A | * | 4/1997 | Maeda et al. ............. | 118/723 IR |
| 6,080,642 A | * | 6/2000 | Van Geelen et al. ........ | 438/478 |
| 6,176,929 B1 | * | 1/2001 | Fukunaga et al. ........... | 118/715 |
| 6,309,465 B1 | * | 10/2001 | Jurgensen et al. .......... | 118/715 |
| 6,485,568 B1 | * | 11/2002 | Thallner ..................... | 118/300 |

FOREIGN PATENT DOCUMENTS

EP         0 334 432        9/1989

* cited by examiner

Primary Examiner—Bret Chen
(74) Attorney, Agent, or Firm—St. Onge Steward Johnston & Reens LLC.

(57) ABSTRACT

The invention relates to a method and to a device for carrying out the method for depositing, in particular, crystalline layers on substrates that are also, in particular, crystalline. According to the invention, at least two process gases are introduced separate from one another into a process chamber of a reactor, whereby the first process gas flows through a central line having a central outlet opening, and the second process gas flows through a line, which is peripheral thereto and which has a peripheral outlet opening. The second process gas flows through one or more supply lines and into a mixing chamber and flows through additional means, which influence the gas stream and which are provided for homogenizing the radial flow profile of the process gas exiting the peripheral outlet opening. The aim of the invention is to obtain a homogeneous radial flow profile by using simple means. To this end, the invention provides that the second process gas flows through a flow influencing element, which is situated downstream from the mixing chamber and which is provided, in particular, in the form of an annular throttle or of turbulence generator, and flows through an annular pre-chamber situated downstream therefrom, after which said second process gas exits through a gas-permeable gas outlet ring.

20 Claims, 9 Drawing Sheets

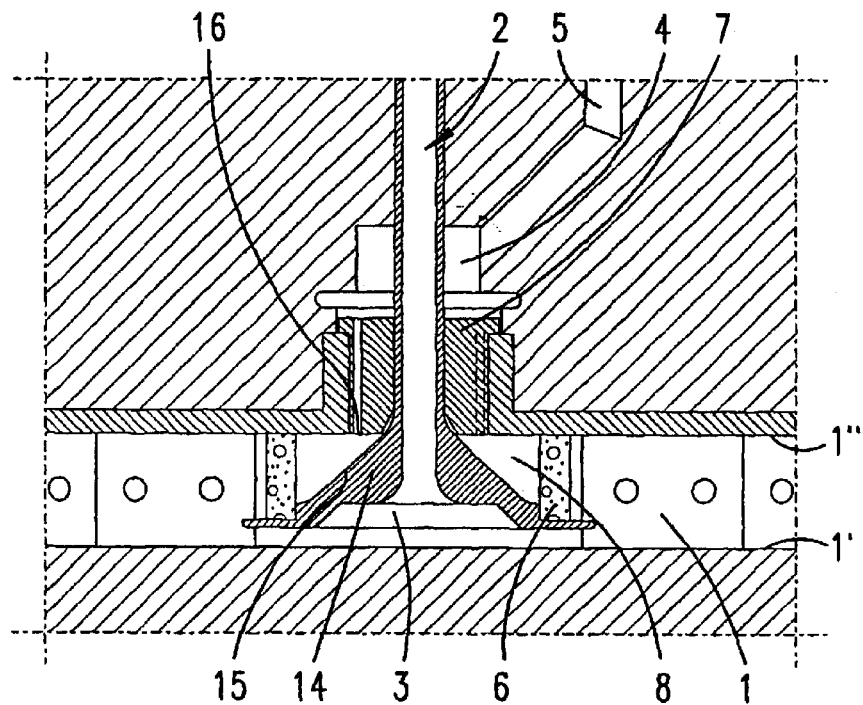
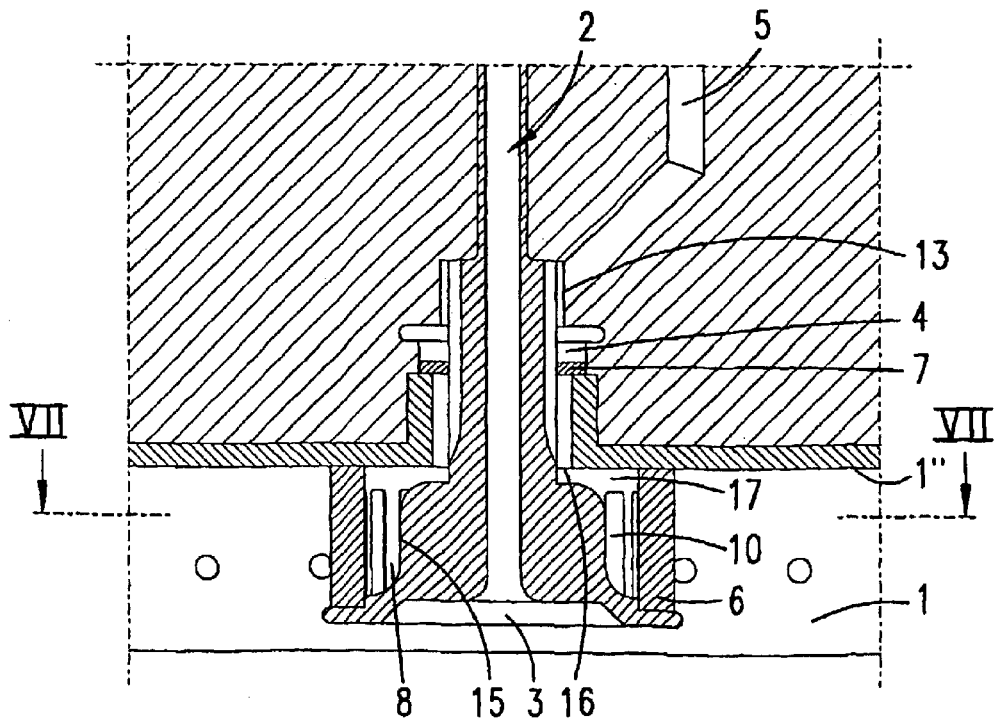

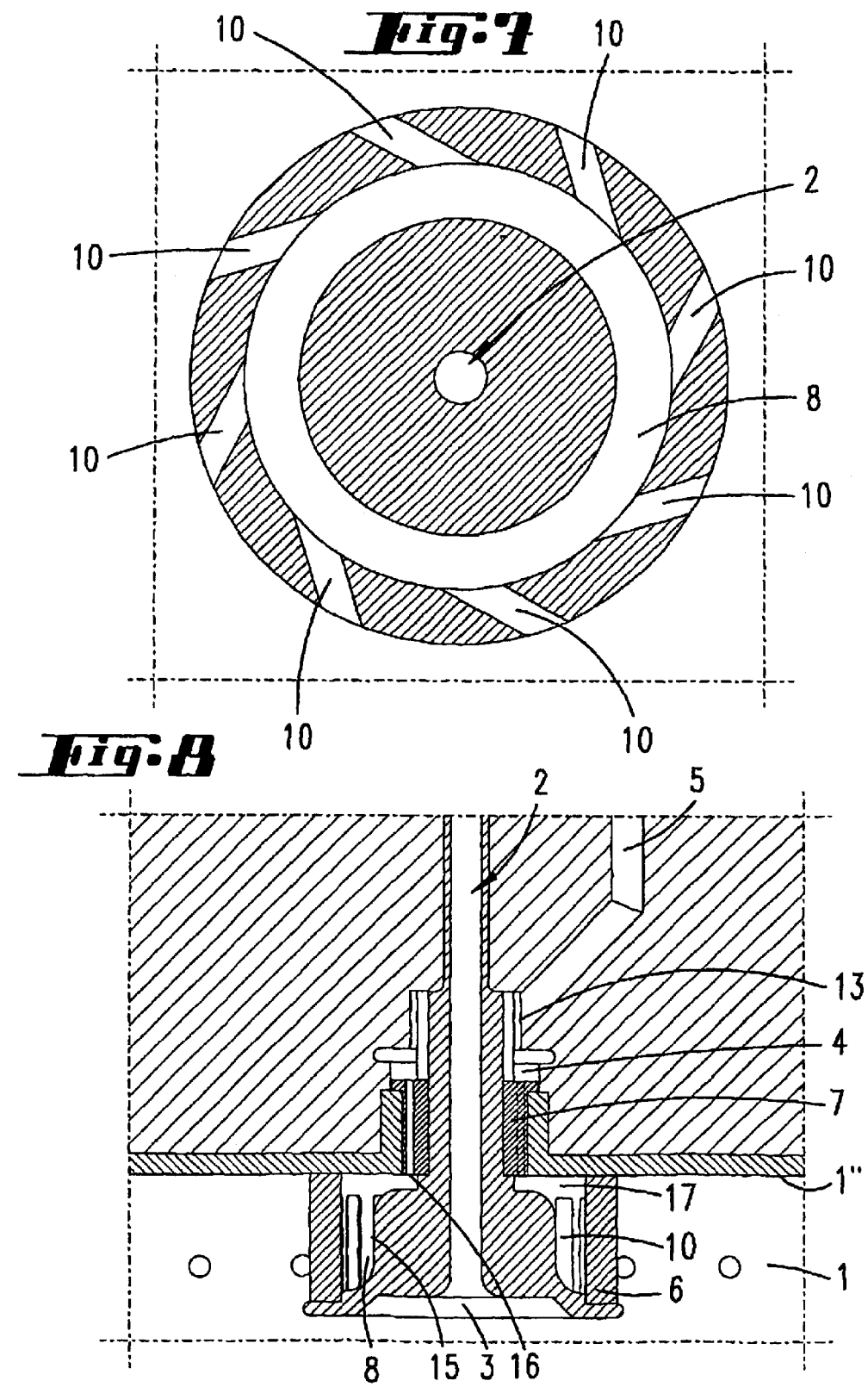

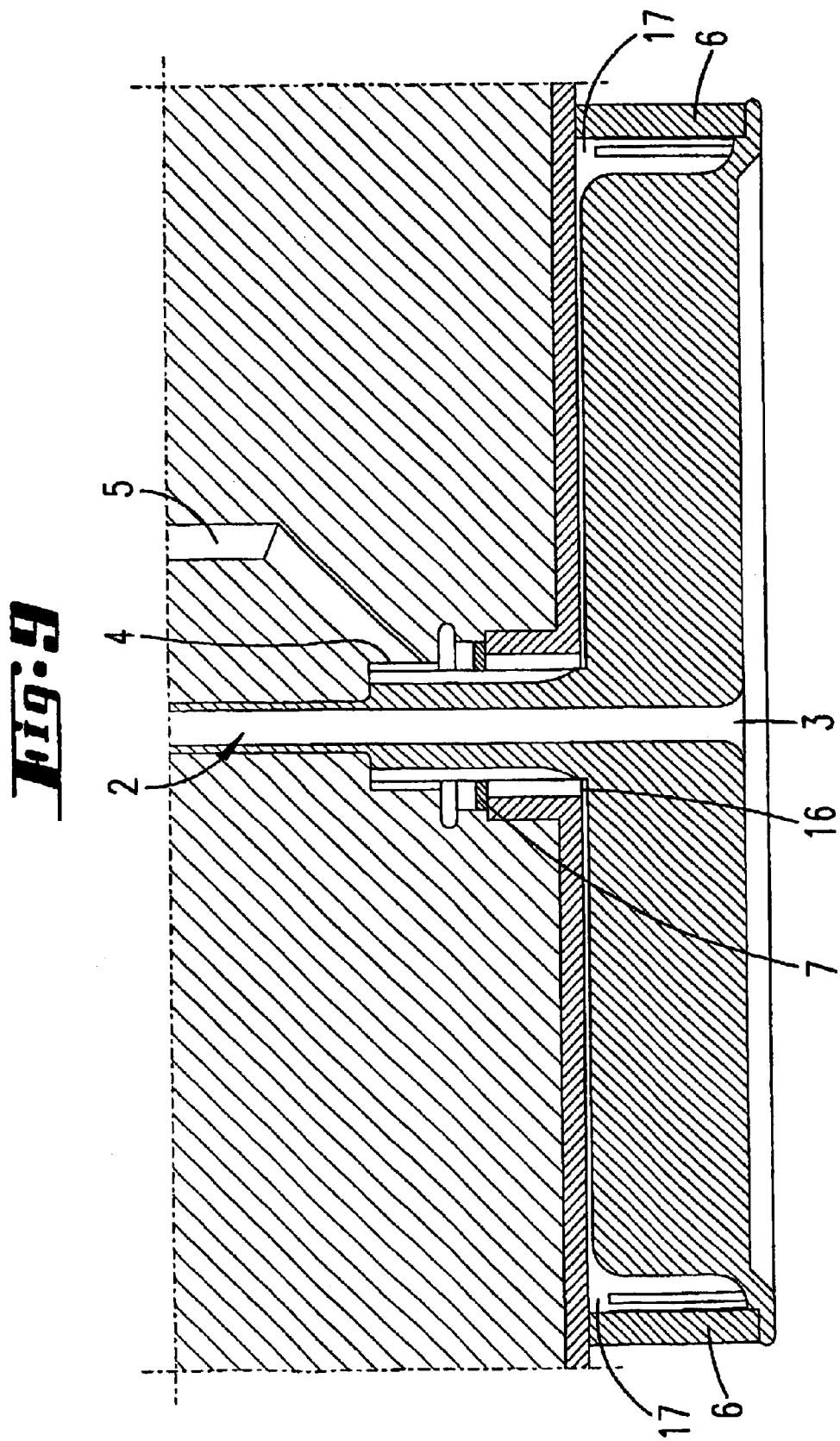

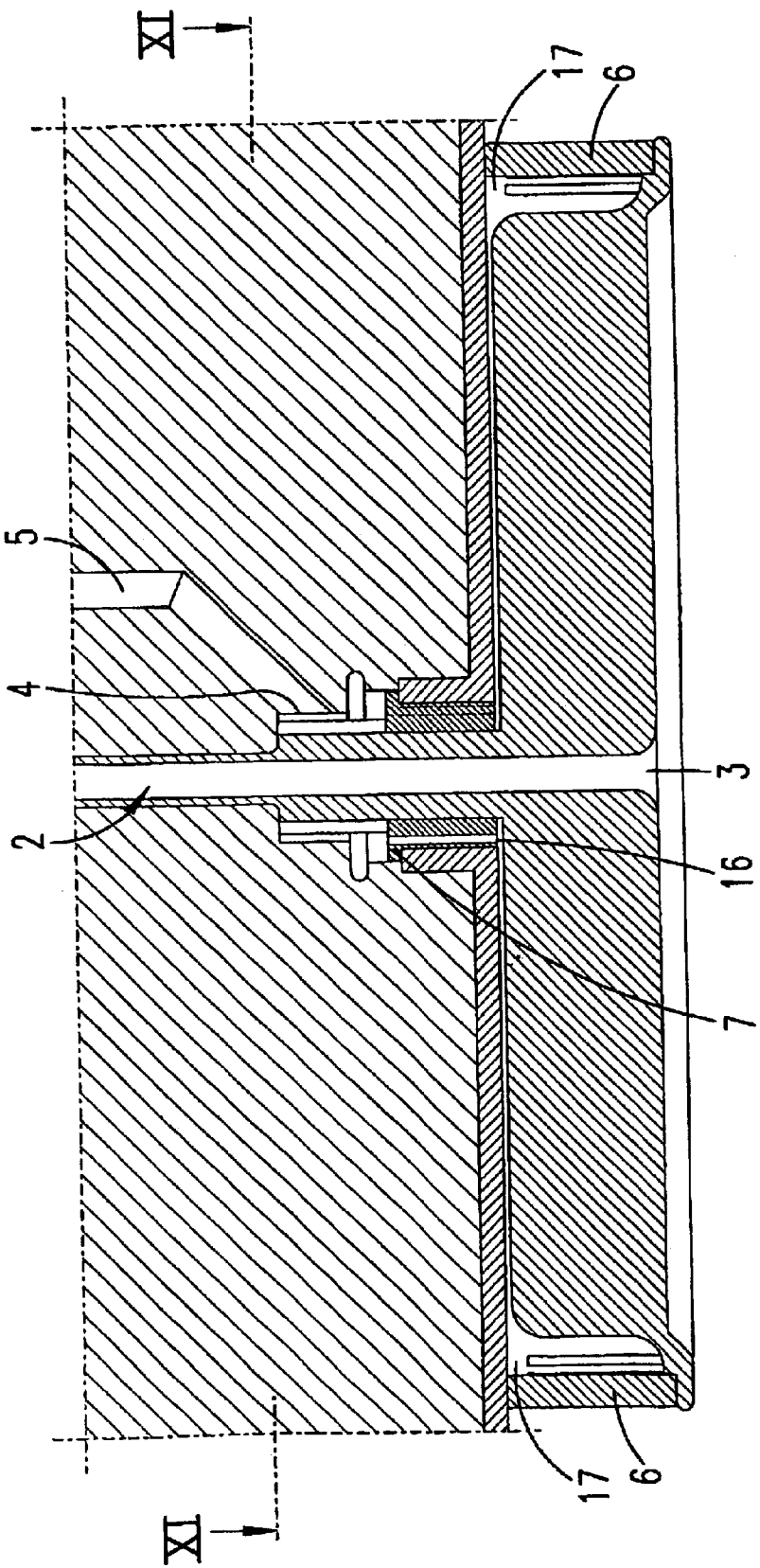

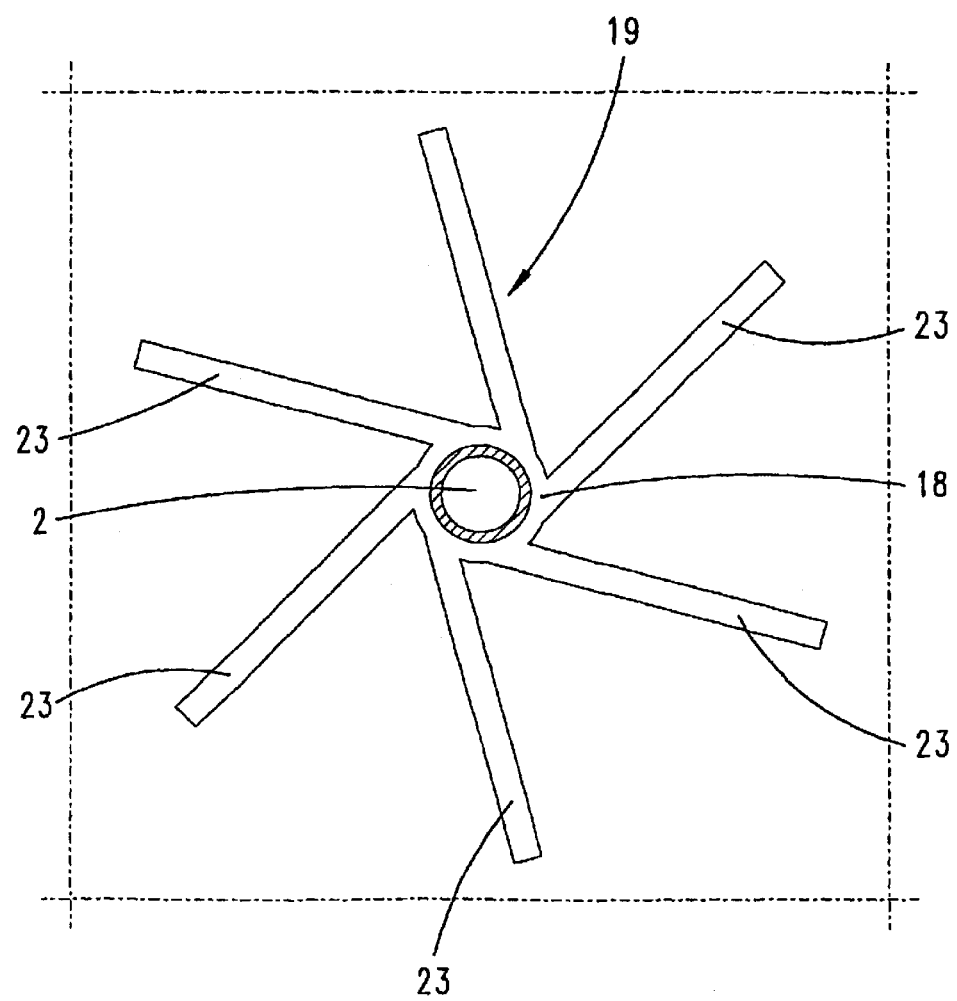

METHOD FOR DEPOSITING IN PARTICULAR CRYSTALLINE LAYERS, GAS-ADMISSION ELEMENT AND DEVICE FOR CARRYING OUT THE METHOD

This application is a continuation of pending International Patent Application No. PCT/EP01/10078 filed Aug. 31, 2001, which designates the United States and claims priority of pending German Application Nos. 10047562, filed Sep. 22, 2000 and 10064944, filed Dec. 23, 2000.

FIELD OF THE INVENTION

The invention relates to a method for depositing in particular crystalline layers on in particular likewise crystalline substrates, in which at least two process gases are introduced into a process chamber of a reactor separately from one another, the first process gas flowing through a central line with a central outlet opening and the second process gas flowing through a line which is peripheral with respect to the central line and has a peripheral outlet opening, the second process gas flowing through a plurality of feed lines into a mixing chamber and through further means, which influence the gas stream, for homogenizing the radial flow profile of the process gas emerging from the peripheral outlet opening.

The invention also relates to a gas-admission element on a device for depositing in particular crystalline layers on in particular likewise crystalline substrates, by means of which at least two process gases can be introduced into a process chamber of a reactor separately from one another, having a central line with a central outlet opening for the first process gas, and having a line, which is peripheral with respect to the central line and has a peripheral outlet opening for the second process gas, which peripheral line has means, which influence the gas stream between one or more feed lines opening out into a mixing chamber and the peripheral outlet opening, for homogenizing the radial flow profile of the process gas emerging from the peripheral outlet opening.

A device of this type is already known, for example from U.S. Pat. No. 6,080,642. This document discloses a gas-admission element with two gas feed lines, each for one process gas, which are fed to the process chamber separately from one another. There, arsine or phosphine is guided through the gas-admission element through a central line. The central line ends at the end side of the substantially rotationally-symmetrically constructed gas-admission element. The second process gas is fed to the gas-admission element from the gas-mixing system by means of a single pipeline. In the region of the gas-admission element, this feed line initially branches into two secondary feed lines. These two secondary feed lines then branch again, into in each case two tertiary feed lines, so that a total of four lines open out symmetrically into a mixing chamber. Individual passages, which branch further to a peripheral outlet opening, lead from this mixing chamber. As a result of fluctuations in the pipe diameter, this cascade-like splitting may lead to inhomogeneous flow conditions. Furthermore, this splitting is not suitable for single-sided, asymmetrical supply of two gases separately from one another.

The invention is based on the object of providing means which also allow the second process gas to be fed asymmetrically into the mixing chamber and with which, nevertheless, even with different kinds of process parameters or reactor geometries, it is possible to achieve a homogenous radial flow profile of the second process gas emerging from the outlet opening.

Furthermore, the invention is based on the object of providing a method with which a homogenous radial flow profile can be achieved by simple means.

The object is achieved by means of the invention specified in the claims. The method proposed in claim 1 provides that the second process gas flows through a flow-influencing element, in particular in the form of an annular throttle or a swirl generator, which is disposed downstream of the mixing chamber, and through an annular antechamber, which is disposed downstream of the flow-influencing element, and emerges through a gas-permeable gas-discharge ring.

The device described in claim 2 provides a flow-influencing element, for example an annular throttle or a swirl generator, which is disposed downstream of the mixing chamber, and an annular antechamber, which is disposed downstream of the flow-influencing element and is surrounded by a gas-permeable gas-discharge ring. The method parameters or the geometric parameters are selected in such a way that the flow resistance of the annular throttle is greater than the flow resistance of the gas-discharge ring by an extent which is such that the pressure difference between antechamber and mixing chamber is greater than the pressure difference between antechamber and process chamber. In a preferred configuration, these two pressure differences differ by at least a factor of 10. However, it is preferable for the difference to be higher. It is possible for a plurality of, in particular two, feed lines to open out asymmetrically into the mixing chamber. It is preferable for the feed lines to open out obliquely, in particular obliquely in the peripheral direction, into the mixing chamber. The gas streams which flow through the feed lines can be regulated individually. In particular, it is provided that different gases flow through the feed lines. By way of example, trimethylgallium or trimethylindium or the like can flow through one feed line. A metal-organic dopant can flow through the other feed line which opens out into the mixing chamber. The flow parameters are set in such a way that the lines all the way up to the outlet openings are held at a temperature at which decomposition of the reaction gases inside the gas-admission element is as far as possible avoided, so that in particular deposition on the gas-discharge ring is avoided. The annular throttle may consist of a gas-impermeable material which has a multiplicity of individual passages. In particular, the annular throttle may consist of quartz. The number of individual passages may be prime relative to the number of feed lines. The result of this is that different spacing in the peripheral direction is formed between the openings of the feed lines and of the individual passages. In particular, neither the points where the feed lines open out nor the individual passages are disposed point-symmetrically with respect to the central axis of the gas-admission element. This too contributes to homogenizing the radial flow profile. In a variant of the invention, the throttle consists of a porous material, for example of porous quartz. It is configured in particular as a frit. However, it may also consist of stainless steel, in particular stainless steel foam. The gas-discharge ring may likewise consist of a porous material, for example quartz. In a variant, the gas-discharge ring has a multiplicity of outlet passages, preferably a number of outlet passages which is prime relative to the individual passages of the annular throttle. The outlet passages may be formed by comb-like, in particular oblique incisions. The diameter of the gas-discharge ring may be greater than the diameter of the annular throttle. In the space of the mixing chamber in front of the annular throttle, a gas pressure which is considerably higher than the gas pressure behind the annular throttle is formed, so that a peripherally symmetrical gas stream flows through the annular throttle. This peripherally symmetrical gas stream opens out into the antechamber. Like the mixing chamber, the antechamber is disposed in the form of a ring around the central line. The antechamber is preferably undivided, so that a pressure which is virtually constant in the peripheral direction is established in the antechamber, this pressure being slightly higher than the pressure in the process chamber surrounding the gas-discharge ring. On account of this slight pressure difference, the gas flows homogeneously, preferably in a laminar flow, through the gas-discharge ring, specifically in the peripheral direction.

In a refinement of the invention, a swirl generator may also be disposed downstream of the mixing chamber. The gas which flows onwards out of the mixing chamber is passed through this swirl generator into a central annual flow chamber, where it becomes mixed on account of the swirling taking place at that location. This swirl generator may be followed by an annular throttle. According to a variant according to the invention, the device has a swirl generator, which is disposed downstream of the mixing chamber, and an annular antechamber, which is disposed downstream of the swirl generator and is surrounded by a gas-permeable gas-discharge ring. In the annular flow chamber which is disposed immediately downstream of the individual passages of the swirl generator, this swirl generator generates an annular flow, so that the reaction gases can mix there. It is preferable for the individual passages of the swirl generator, through which medium flows radially inward, to open out, with an inclination with respect to the axis transverse plane, into the annular flow chamber. The annular flow chamber can widen out in the downstream direction. On the radially outer side, it may be delimited by a diverter collar over which medium can flow in the upstream direction. On account of the flow deflection in the opposite direction, a steady toroidal swirl forms in the widened extension of the annular flow chamber. This swirl too effects homogenization of the gas composition. Together with the peripheral flow flowing around the central feed line in the annular flow chamber, this toroidal swirl effects an improvement in the intimate mixing of the gases. Since the volume of the annular flow chamber including the widening disposed downstream is in the region of one or several milliliters, the swirls have only a negligible storage function. An annular throttle may be associated with the diverter collar to the rear. This annular throttle may have a multiplicity of bores through which the gas flows. The bores may be directed at a deflector wall of a deflector collar. This deflector collar may be formed by a radially inwardly directed projection around which the gas flows.

A variant of the method consists in at least two feed lines opening out into the mixing chamber. According to the invention, more than ten times as much gas flows through one of the feed lines as through the at least one further feed line. This considerable difference in the volumetric flows results in improved intimate mixing of the gas in the mixing chamber. With this procedure, it is even possible to dispense with an annular throttle or a swirl generator. It is preferable for more than fifteen times as much gas to flow through the one feed line as through the at least one further feed line or through all the further feed lines together.

BRIEF DESCRIPTION OF THE DRAWINGS

Exemplary embodiments of the invention are explained below with reference to accompanying drawings, in which:

FIG. 5 shows a second exemplary embodiment of the invention in an illustration corresponding to that shown in FIG. 1, FIG. 6 shows a third exemplary embodiment of the invention in an illustration corresponding to that shown in FIG. 1, FIG. 7 shows a section on line VII—VII in FIG. 6, FIG. 8 shows a fourth exemplary embodiment of the invention in an illustration corresponding to that shown in FIG. 1, FIG. 9 shows a fifth exemplary embodiment of the invention in an illustration corresponding to that shown in FIG. 1, FIG. 10 shows a sixth exemplary embodiment of the invention in an illustration corresponding to that shown in FIG. 1, FIG. 14 shows a section on line XIII—XIII in FIG. 12.

DETAILED DESCRIPTION OF THE DRAWINGS

Figure 1:
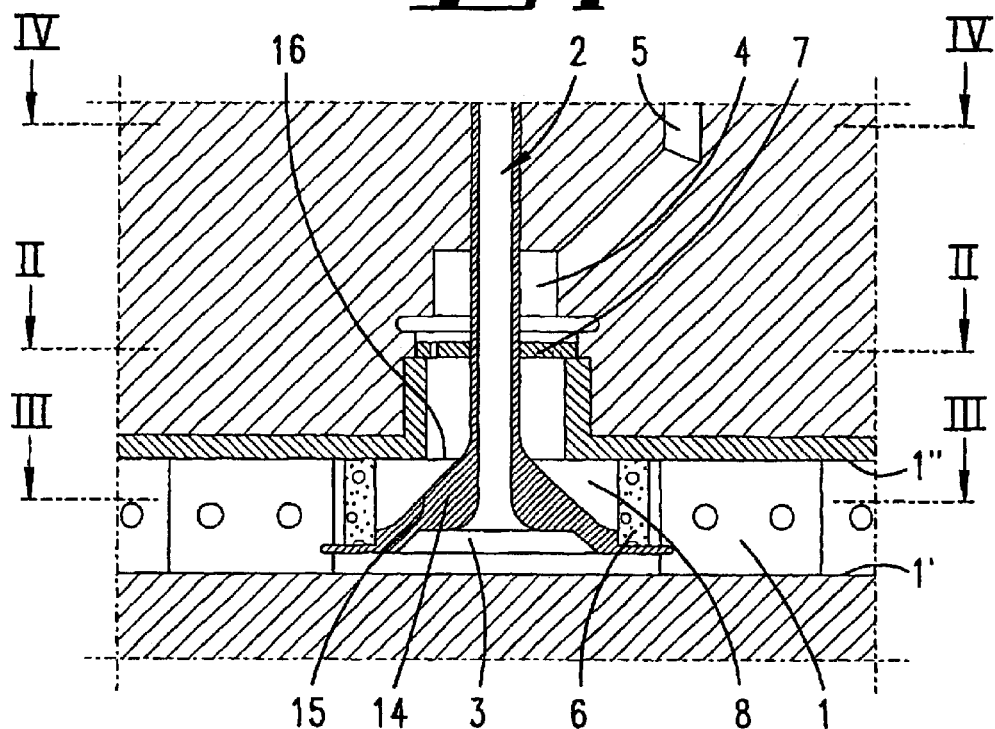
FIG. 1 shows a first exemplary embodiment of the invention in a sectional illustration, in which the pertinent components of the gas-admission element, which is fitted in a reactor, are illustrated diagrammatically.
Figure 2:
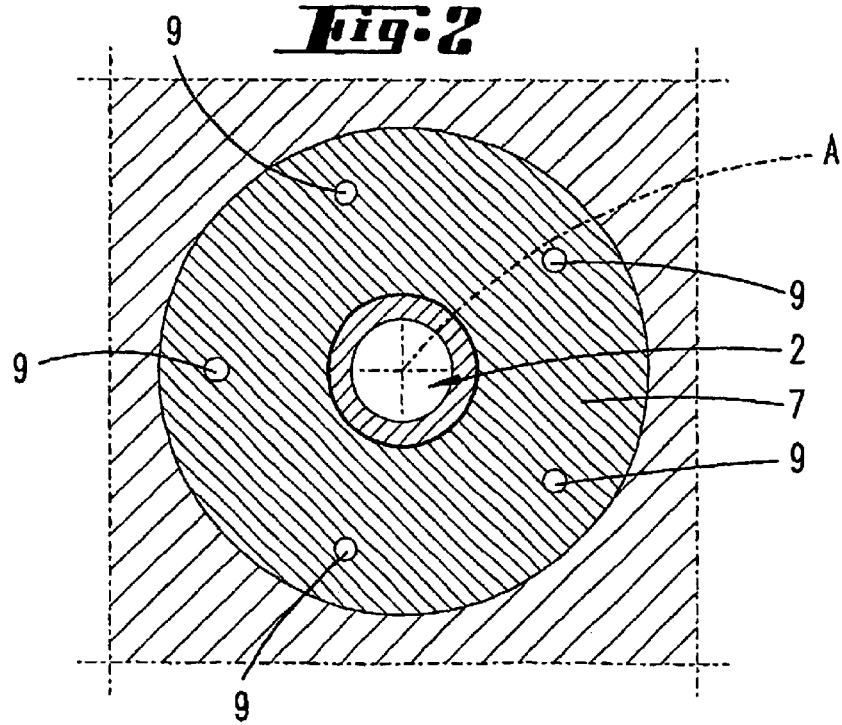
FIG. 2 shows a section on line II—II in FIG. 1.
Figure 3:
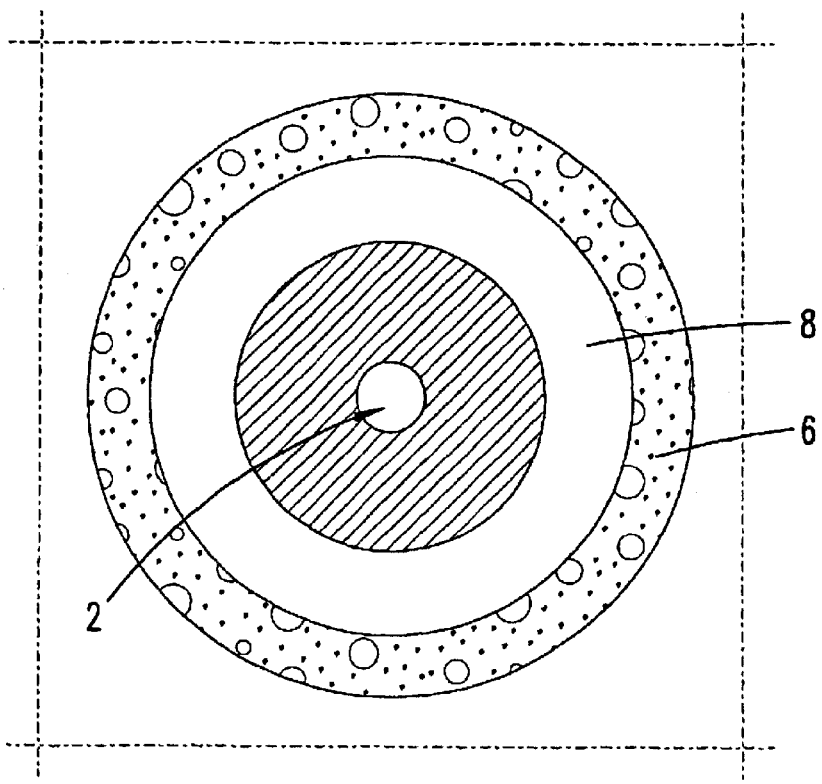
FIG. 3 shows a section on line III—III in FIG. 1.

The gas-admission element is used in an epitaxy reactor, in which semiconductor layers are deposited on semiconductor substrates in particular from metal-organic compounds and hydrides. A device of this type is shown, for example, in U.S. Pat. No. 6,080,642. The reactor has a substrate carrier which is substantially in the form of a circular disc and on which the substrates, which are located on rotationally driven substrate holders, are disposed in planetary fashion. Furthermore, the gas-admission element according to the invention is also suitable for other devices for depositing in particular crystalline layers on in particular likewise crystalline substrates. In particular, the gas-admission element according to the invention, on account of a modular structure, can be matched to different process parameters, such as carrier gases (hydrogen, nitrogen or noble gases) and process temperatures. Furthermore, the gas-admission element can be matched to different process temperatures by selecting suitable components.

The reactor has a process chamber 1, which has a process-chamber base 1" and a process-chamber ceiling 1". The gas-admission element is located in the center of the process chamber 1. In regions, it projects into the space between base 1' and ceiling 1". The gas-admission element has a central line 2, through which arsine or phosphine flows into the process chamber 1. This hydride emerges from a substantially funnel-shaped central outlet opening 3 at the end side of the gas-admission element. At the peripheral side of the gas-admission element there is a gas-discharge ring 6, which is supported on an edge portion of a gas-discharge ring carrier 14 which also forms the central line 2. The gas-discharge ring 6 engages against the ceiling 1" of the process chamber 1 by means of its upper end face.

The gas-discharge ring 6 is gas-permeable, on account of the fact that it is either made from a porous material or has openings. The openings may be formed as slots. The exemplary embodiment which is illustrated in the first two exemplary embodiments (FIGS. 1 to 5) has a gas-discharge ring 6 which is made from porous quartz. In the exemplary embodiment illustrated in FIGS. 6 to 10, the gas-discharge ring 6 has a multiplicity of outlet passages 10, which are formed as slots which are open towards one edge of the gas-discharge ring 6. Overall, therefore, this gas-discharge ring 6 has a comb-like structure.

As can be seen from FIG. 7, the individual outlet passages 10 may be formed as incisions which run obliquely with respect to the center.

At the rear of the gas-admission ring 6 there is an annular antechamber 8. The shape of the rear wall 15 of the antechamber 8 is dependent on the configuration of the gas-discharge ring 6. If the gas-discharge ring 6 is formed as a porous body, the rear wall 15 is preferably frustoconical, so that the second process gas also flows uniformly through the gas-discharge ring 6 in the axial direction.

Upstream of the antechamber 8 there is an annular cavity in the gas-discharge element. In this annular cavity there is an annular throttle 7. In the exemplary embodiment illustrated in FIG. 1, the annular throttle 7 comprises a circular quartz disc with five individual passages 9 which are oriented either parallel or obliquely with respect to the axis of the gas-discharge element.

In the exemplary embodiment illustrated in FIG. 5, the annular throttle 7 is of similar configuration. However, it has a considerably greater thickness, i.e. in the exemplary embodiment illustrated in FIG. 5, the individual passages 9 are longer than in the exemplary embodiment illustrated in FIG. 1.

In the exemplary embodiment shown in FIGS. 6 to 10, the antechamber rear wall 15 has a bell-shaped structure, so that a narrow entry gap 16 is formed, with a deflector wall 17 opposite it. The deflector wall 17 is formed by an edge portion of the gas-discharge ring from which the comb-like tines start. Upstream of the inlet gap 16, in this case too there is the annular throttle 7, which has a smaller diameter than the gas-discharge ring 6.

The throttle may also consist of a porous material, for example of porous quartz. It is also conceivable for the throttle 7 to be produced from stainless steel foam or from another material which presents flow resistance. The properties of the annular throttle 7 and gas-admission ring 6 are matched to one another in such a way that the annular throttle 7 presents a greater flow resistance to the gas stream than the gas-discharge ring 6. The result of this is that the pressure difference between the mixing chamber 4 disposed upstream of the annular throttle 7 and the antechamber 8 is greater than the pressure difference between the antechamber 8 and the process chamber 1. The difference between the two pressure differences is at least a factor of 10. However, it may even amount to a factor of 100. By way of example, a pressure difference of from 1 to 100 mbar may be established at the throttle, while the pressure difference between antechamber and process chamber is only 0.1 mbar.

Figure 4:
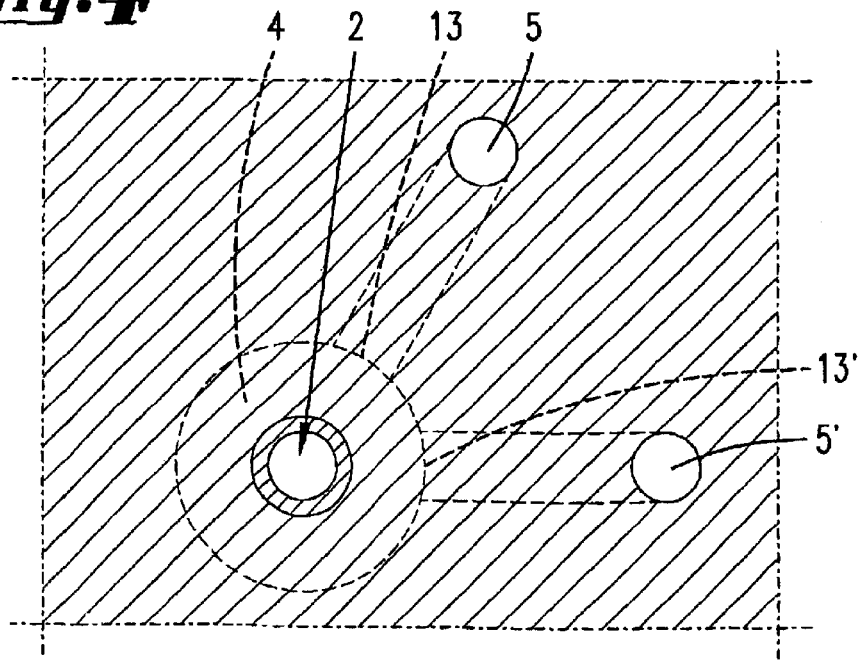
FIG. 4 shows a section on line IV—IV in FIG. 1.
Figure 11:
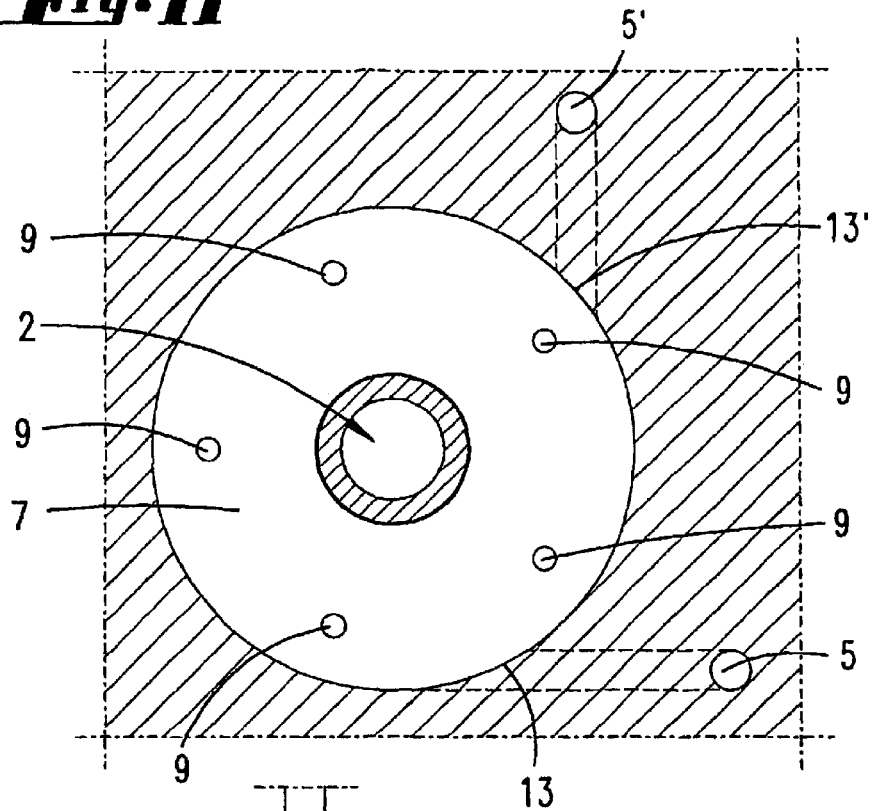
FIG. 11 shows a section on line XI—XI in FIG. 10.
Figure 12:
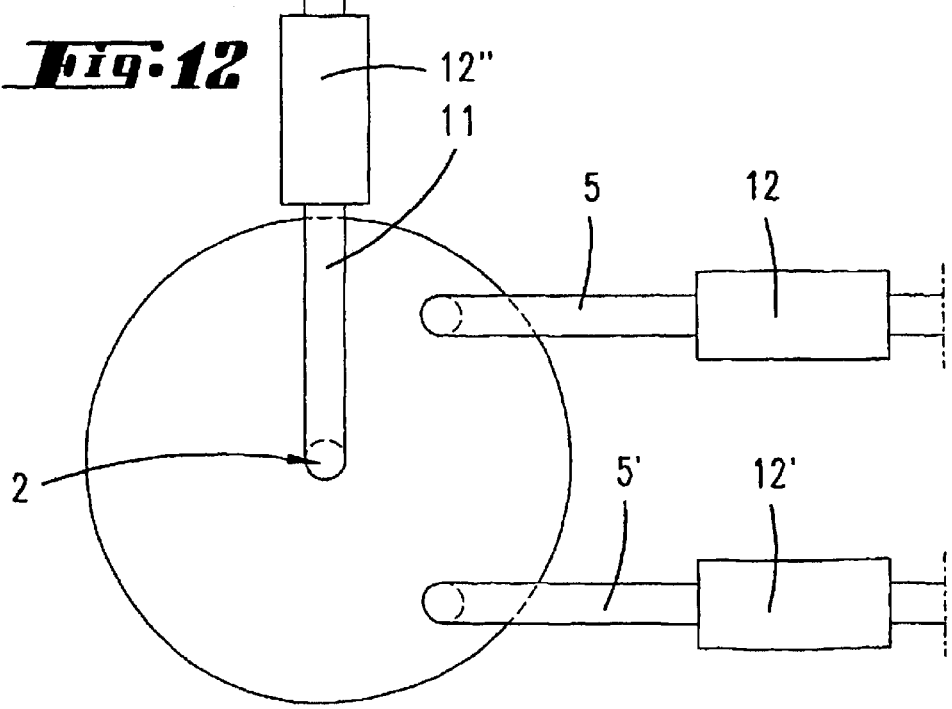
FIG. 12 shows a diagrammatic illustration of the feed lines leading to the gas-admission element.

As can be seen in particular from FIGS. 4, 11 and 12, the feed lines 5 for the second process gas are located asymmetrically with respect to the central axis A, which lies in the center of the central line 2. At the locations which are indicated by reference numerals 13 and 13', the two feed lines 5, 5' open out into the annular mixing chamber 4. They may open out into the mixing chamber 4 obliquely with respect to the radial direction, so that a rotational movement of the gas stream can be established in the mixing chamber 4.

In the exemplary embodiment, five individual passages 9 are associated with the two feed lines 5, 5' or openings 13, 13'. Sixteen outlet passages 10 of the gas-discharge ring 6 are associated with these five individual passages 9.

As can be seen from FIG. 12, each of the two feed lines 5, 5' has an individual mass-flow regulator 12, 12' for regulating the incoming gas flow. The feed line 11 leading to the central line 2 also has a mass-flow regulator 12''' of this type.

The exemplary embodiment illustrated in FIGS. 9 and 10 has a gas-discharge ring carrier 14, which has an enlarged end face and an enlarged peripheral collar, on which a gas-discharge ring 6 with a large diameter is seated.

The choice of diameters of the gas-discharge ring 6 and/or of the area of the outlet passages 10 and the way in which they are adapted to the flow resistance of the annular throttle 7 are affected as a function of the viscosity and density of the gas used.

It is preferable for the choice to be such that the Reynolds number in the individual passages 9 of the throttle is greater than the Reynolds number in the outlet passages 10 of the gas-discharge ring.

Figure 13:
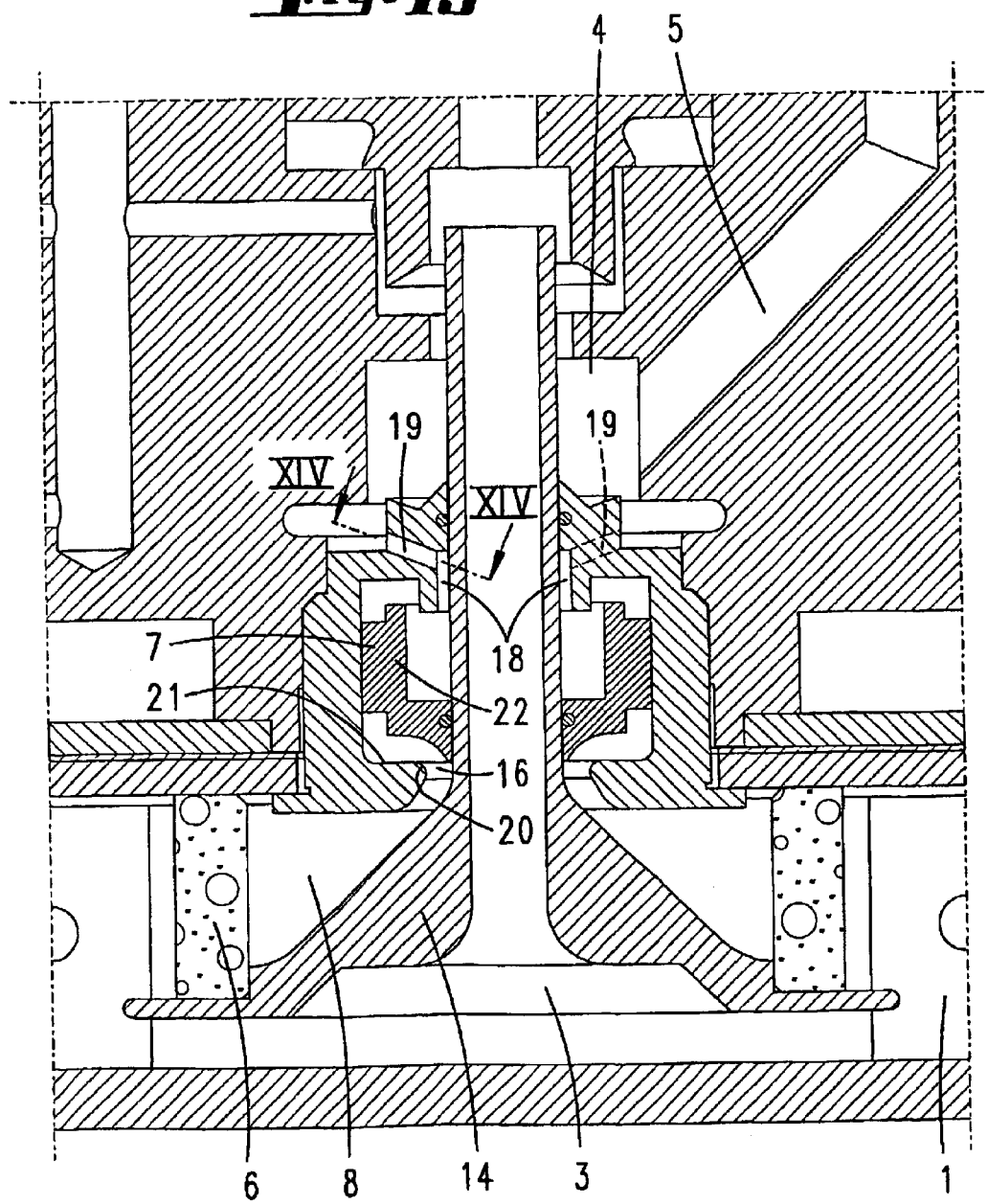
FIG. 13 shows a seventh exemplary embodiment of the invention.

In the exemplary embodiment illustrated in FIGS. 13 and 14, a swirl generator 19 is disposed behind the mixing chamber 4. This swirl generator 19 has a multiplicity of individual passages 23 which are directed radially inwards, obliquely and at an angle with respect to the axial transverse plane and which open out tangentially into an annular flow chamber 18, which is disposed in the region of the casing of the central line 2. On account of the individual passages 23 opening out tangentially into the annular flow chamber 18, a swirl which runs around the central line 22 is formed there.

The annular flow chamber 18 continues in the downstream direction and in the process becomes larger in the radial direction. In this enlarged region, the annular flow chamber 18 is delimited on the radially outer side by a diverter collar 22, over which gas flows in the upstream direction. On account of the countercurrent, a toroidal eddy is formed in this enlarged section, which is disposed downstream of the annular flow chamber 18.

At the back of the diverter collar 22 there is an annular throttle 7. This annular throttle 7 comprises a multiplicity of axial bores. The axial bores, which are not shown in the drawings, open out in the direction of a deflector wall 21. The deflector wall 21 is formed by a deflector collar 20, which extends radially inwards and defines the inlet gap 16. As an alternative to the axial bores, it is also possible to provide obliquely running bores.

According to a development of the method according to the invention, it is provided that at least two feed lines 5 open out into the mixing chamber 4. According to the invention, at least ten times as much gas, preferably fifteen times as much gas is to flow through one of these feed lines as through all the other feed lines 5 which open out into the mixing chamber. As a result, turbulence is developed in the mixing chamber 4, so that the gas stream directed downstream acquires a virtually homogenous gas composition in the peripheral direction.

All features disclosed are (inherently) pertinent to the invention. The disclosure content of the associated/appended priority documents (copy of the prior application) is hereby incorporated in their entirety in the disclosure of the present application, partly with a view to incorporating features of these documents in claims of the present application.

What is claimed is:

1. Gas-admission element on a device for depositing crystalline layers on likewise crystalline substrates, by means of which at least two process gases can be introduced into a process chamber of a reactor separately from one another, having a central line with a central outlet opening for the first process gas, and having a line, which is peripheral with respect to the central line and has a peripheral outlet opening for the second process gas, which peripheral line has means, which influence the gas stream and are disposed between one or more feed lines opening out into a mixing chamber and the peripheral outlet opening, for homogenizing the radial flow profile of the process gas emerging from the peripheral outlet opening, characterized by a flow-influencing element, in the form of an annular throttle or a swirl generator, which is disposed downstream of the mixing chamber, and an annular antechamber, which is disposed downstream of the flow-influencing element and is surrounded by a gas-permeable gas-discharge ring.

2. Gas-admission element according to claim 1, characterized in that the flow resistance of the annular throttle is greater than the flow resistance of the gas-discharge ring by an extent which is such that the pressure difference between antechamber and mixing chamber is greater than the pressure difference between antechamber and process chamber.

3. Gas-admission element according to claim 2, characterized in that the two pressure differences differ by at least a factor of ten.

4. Gas-admission element according to claim 3, characterized in that the feed lines open out asymmetrically into the mixing chamber.

5. Gas-admission element according to claim 4, characterized in that the feed lines open out obliquely into the mixing chamber.

6. Gas-admission element according to claim 5, characterized in that the gas streams which flow through the feed lines are regulated individually.

7. Gas-admission element according to claim 6, characterized in that the annular throttle has a multiplicity of individual passages which are axially parallel or run obliquely with respect to the axis, the number of which individual passages is prime relative to the number of feed lines.

8. Gas-admission element according to claim 7, characterized in that the points where the feed lines open out and/or the individual passages are not disposed point-symmetrically with respect to the central axis of the gas-admission element.

9. Gas-admission element according to claim 8, characterized in that the annular throttle consists of a porous material.

10. Gas-admission element according to claim 9, characterized in that the gas-discharge ring has a multiplicity of outlet passages, a number of outlet passages which is prime relative to the individual passages of the annular throttle.

11. Gas-admission element according to claim 10, characterized in that the outlet passages are formed by comb-like, in particular oblique incisions.

12. Gas-admission element according to claim 11, characterized in that the diameter of the gas-outlet ring is greater than the diameter of the annular throttle.

13. Gas-admission element according to claim 12, characterized in that the gas-outlet ring is carried by an edge collar of a gas-discharge ring carrier, the frustoconical or bell-shaped outer wall of which forms the antechamber rear wall and in the end face of which the central outlet opening is disposed.

14. Device for depositing crystalline layers on likewise crystalline substrates, having a gas-admission element according to claim 1.

15. Device according to claim 14, characterized in that the shaped end wall of the gas-discharge ring borders the ceiling of a process chamber.

16. Device according to claim 15, characterized in that a swirl generator is disposed downstream of the mixing chamber.

17. Device according to claim 16, characterized in that the individual passages of the swirl generator, through which medium flows radially inward, open out, with an inclination with respect to the axis transverse plane, into an annular flow chamber.

18. Device according to claim 17, characterized in that the annular flow chamber widens out in the downstream direction and on the radially outer side is delimited by a diverter collar over which medium can flow in the upstream direction.

19. Device according to claim 18, characterized by an annular throttle which is disposed radially outward with respect to the diverter collar.

20. Device according to claim 19, characterized in that a multiplicity of bores, which form the annular throttle, are directed at a deflector wall of a deflector collar.

\* \* \* \* \*